(12) United States Patent
Holland et al.

(10) Patent No.: US 9,702,928 B2
(45) Date of Patent: Jul. 11, 2017

(54) SELF-HEALING ARRAY SYSTEM AND METHOD

(71) Applicant: The Boeing Company, Chicago, IL (US)

(72) Inventors: Gavin D. Holland, Oak Park, CA (US); David L. Allen, Thousand Oaks, CA (US)

(73) Assignee: THE BOEING COMPANY, Chicago, IL (US)

( * ) Notice: Subject to any disclaimer, the term of this patent is extended or adjusted under 35 U.S.C. 154(b) by 332 days.

(21) Appl. No.: 14/155,612

(22) Filed: Jan. 15, 2014

(65) Prior Publication Data

US 2015/0198656 A1    Jul. 16, 2015

(51) Int. Cl.
| | |
|---|---|
| *H03F 3/21* | (2006.01) |
| *G01R 31/28* | (2006.01) |
| *H03F 3/68* | (2006.01) |
| *G01S 7/40* | (2006.01) |
| *H01Q 3/26* | (2006.01) |
| *H01Q 21/00* | (2006.01) |
| *G01S 13/02* | (2006.01) |

(52) U.S. Cl.
CPC ........ *G01R 31/2836* (2013.01); *G01S 7/4017* (2013.01); *H01Q 3/267* (2013.01); *H01Q 21/0025* (2013.01); *H03F 3/21* (2013.01); *G01S 2013/0245* (2013.01); *H03F 2200/462* (2013.01); *H03F 2200/465* (2013.01); *H03F 2200/468* (2013.01)

(58) Field of Classification Search
USPC ................................ 330/2, 295, 124 R, 289
See application file for complete search history.

(56) References Cited

U.S. PATENT DOCUMENTS

| | | | |
|---|---|---|---|
| 5,682,165 A | 10/1997 | Lewis et al. | |
| 6,084,541 A | 7/2000 | Sayegh | |
| 6,806,772 B2 * | 10/2004 | Glaser .................... | H03F 3/189 330/289 |
| 7,126,417 B2 * | 10/2006 | Bishop ........................... | 330/51 |
| 7,324,042 B2 | 1/2008 | Werntz et al. | |
| 7,423,488 B2 | 9/2008 | Hunter et al. | |
| 7,471,237 B2 | 12/2008 | Wooldridge | |

(Continued)

FOREIGN PATENT DOCUMENTS

| | | |
|---|---|---|
| EP | 2107637 A1 | 10/2009 |
| WO | 2013003733 A2 | 1/2013 |

OTHER PUBLICATIONS

European Patent Office, European Search Report, Application No. 14197847.8-1812, pp. 1-6, dated Jun. 12, 2015.

(Continued)

*Primary Examiner* — Hieu Nguyen

(57) ABSTRACT

Failure in a self-healing array may be handled by: detecting a failing element of the self-healing array by monitoring characteristics of the failing element; auto-correcting a failing element of the self-healing array by adjusting characteristics of the failing element to compensate for a portion of the failing element which is failing; or correcting performance of the self-healing array when one or more elements of the self-healing array fail by detecting and modeling an impact of the one or more elements of the self-healing array which failed on the performance of the self-healing array.

17 Claims, 2 Drawing Sheets

(56) References Cited

U.S. PATENT DOCUMENTS

| | | |
|---|---|---|
| 7,522,096 B2 | 4/2009 | Backes et al. |
| 7,714,775 B2 | 5/2010 | Navarro et al. |
| 2009/0102717 A1 | 4/2009 | Lok et al. |
| 2010/0033375 A1 | 2/2010 | Mason et al. |
| 2011/0057712 A1* | 3/2011 | Bowers et al. ............... 327/419 |
| 2011/0241941 A1 | 10/2011 | Krich et al. |

OTHER PUBLICATIONS

Rolf Isermann, "Process Fault Detection Based on Modeling and Estimation Methods—A Survey," Automatica, 20 (4): 387-404, 1984.

* cited by examiner

SELF-HEALING ARRAY SYSTEM AND METHOD

FIELD OF THE DISCLOSURE

This disclosure relates to adding self-healing properties to phased array systems and methods.

BACKGROUND

Current approaches for the self-healing of arrays typically require the array to be offline before the array can be diagnosed and reconfigured to compensate for failures. This may result in down-time, expense, and the inability to self-heal the array while the array is online which may lead to subpar performance of the array. Other current self-healing arrays may experience varying types of issues such as the necessity of adding expensive hardware to self-heal the array.

A self-healing array system and method is needed to overcome one or more issues of one or more of the current self-healing arrays or methods of use.

SUMMARY

In one embodiment, a method of handling failure in a self-healing array is disclosed. In one step, a failing element of the self-healing array is detected by monitoring characteristics of the failing element.

In another embodiment, a method of handling failure in a self-healing array is disclosed. In one step, a failing element of the self-healing array is auto-corrected by adjusting characteristics of the failing element to compensate for a portion of the failing element.

In still another embodiment, a method of handling failure in a self-healing array is disclosed. In one step, performance of the self-healing array is corrected when one or more elements of the self-healing array fail by detecting and modeling an impact of the one or more elements of the self-healing array which failed on the performance of the self-healing array.

The scope of the present disclosure is defined solely by the appended claims and is not affected by the statements within this summary.

BRIEF DESCRIPTION OF THE DRAWINGS

The disclosure can be better understood with reference to the following drawings and description. The components in the figures are not necessarily to scale, emphasis instead being placed upon illustrating the principles of the disclosure.

DETAILED DESCRIPTION

In one embodiment, the instant disclosure relates to a system and method for in-flight self-diagnosis and self-healing of a digitally-controlled phased-array radar that has suffered degradation or loss of one or more transmit receive (T/R) modules. The approach integrates diagnostics, failure classification, auto-correction, and multiple stages of reconfiguration to compensate for T/R module degradation and/or failures to maximize utility of the array while it is in active use, possibly in some degraded mode of operation within tolerable performance characteristics. In other embodiments, the instant disclosure may be used in varying systems and methods.

Figure 1:
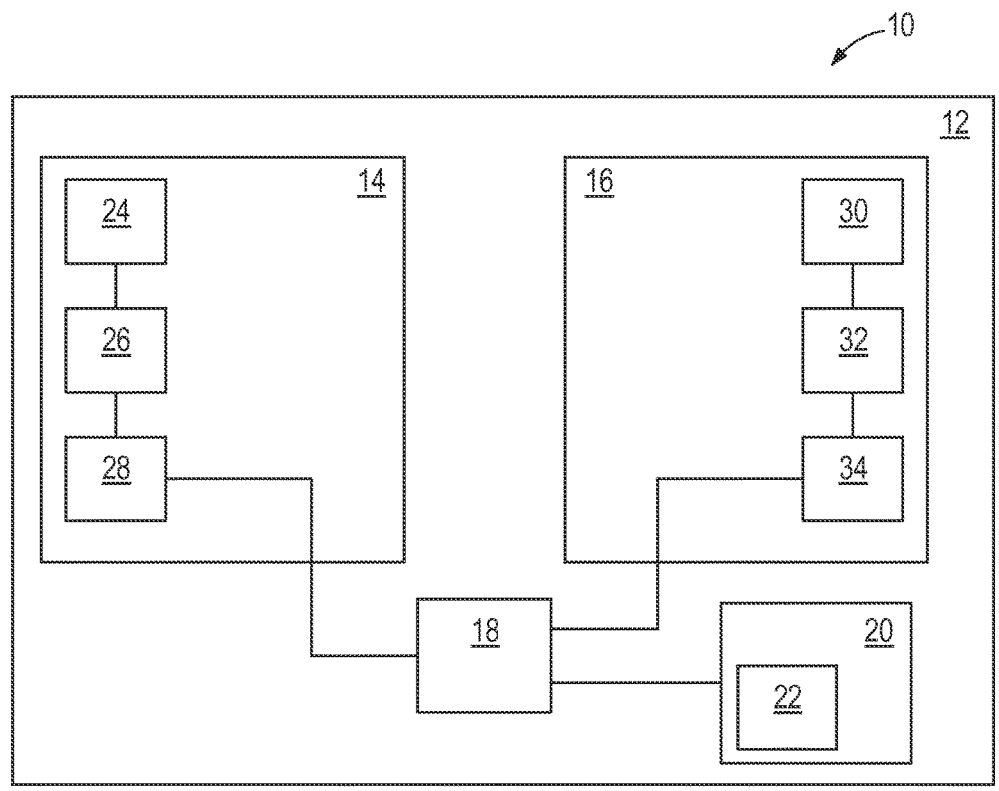
FIG. 1 is a box diagram illustrating one embodiment of a system comprising a digitally-controlled phased-array radar.

FIG. 1 is a box diagram illustrating one embodiment of a system 10 comprising a digitally-controlled phased-array radar. The system 10 includes a self-healing array 12 comprising a plurality of elements 14 and 16, a processor 18, a memory 20, and a programming code 22. For simplicity only two elements 14 and 16 are shown but the self-healing array 12 may include any number of elements 14 and 16. Element 14 includes an antenna 24, an amplifier module 26, and a driver module 28. The antenna 24 is configured to both transmit and receive a radar signal. The amplifier module 26 is in electronic communication with the antenna 24. The amplifier module 26 includes power amplifiers for transmitting the radar signal, low-noise amplifiers for receiving the return radar signal, switches to connect the amplifiers to the antenna elements, and data, diagnostic, and control lines. The amplifier module 26 may further include additional components and circuitry for purposes of sensing, diagnostics, control, and redundancy. In other embodiments, the amplifier module 26 may contain further varying components. The driver module 28 is in electronic communication with the amplifier module 26. The driver module 28 controls the amplifier module 26.

Element 16 includes a calibration port 30, an amplifier module 32, and a driver module 34. Calibration port 30 is a unique antenna element that is designed specifically for calibrating the general transmit/receive array elements. In one embodiment, the calibration port 30 is a simple diode antenna element. In other embodiments, the calibration port 30 may vary. Amplifier module 32 is an amplifier module that is designed specifically for driving the calibration port 30 antenna for the purposes of calibrating the general transmit/array elements. Thus, it incorporates transmit and receive amplifiers with performance characteristics (e.g. sensitivity, noise figure, output power, stability, lifetime) that exceed those of the general transmit/array elements, and which are calibrated to precise tolerances such that the amplifiers' performances are sufficiently high to be regarded as a 'true' reading of the transmit/array elements' performance. Driver module 34 is a digital driver module that is specifically designed to control the amplifier module 32, incorporating modes of operation required for calibration activities (e.g. broader control and range on transmit and receive paths, highly sensitive receive path, and greater precision of amplitude and phase control).

The processor 18 is in electronic communication with elements 14 and 16 and with memory 20. The memory 20 includes the programming code 22 which runs the processor 18. The programming code 22 is configured to implement the methods of the instant disclosure to handle failure in the self-healing array 12. The processor 18, following the programming code 22, is configured to provide instructions to the elements 14 and 16 and to the self-healing array 12. The processor 18 is configured to control the driver modules 28 and 34. The system 10 is configured to implement the methods of the instant disclosure to handle failure in the self-healing array 12. In other embodiments, one or more components of the system 10 may vary in type, number, or function, one or more components of the system 10 may be absent, or the system may include one or more additional components. Although the methods of the instant disclosure are applicable to digitally-controlled phased-array radars in general, its main embodiment is software and hardware designed for a radar with independently controllable transmit/receive ("T/R") elements that are built using hardware technology that has reliability characteristics that are not well established.

Figure 2:
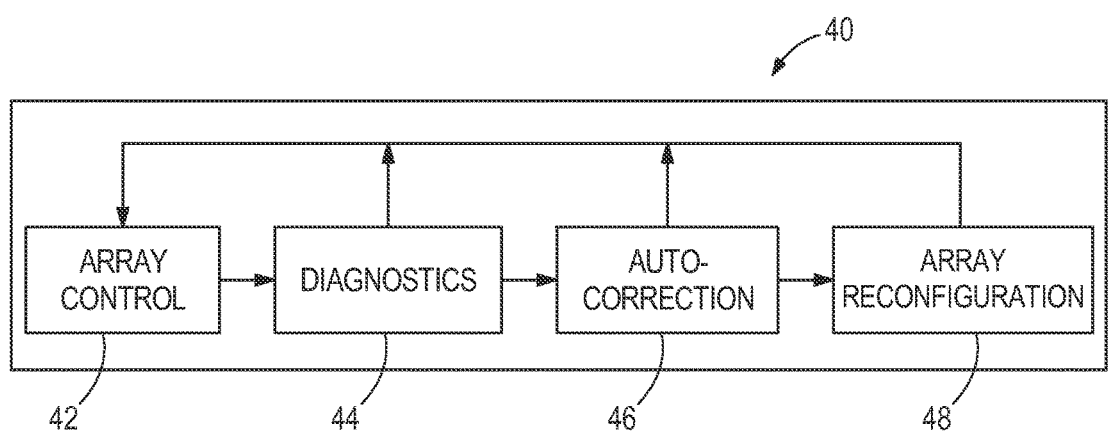
FIG. 2 illustrates one embodiment of a box diagram for an array system of handling failure in a self-healing array.

FIG. 2 illustrates one embodiment of a box diagram for an array system 40 of handling failure in a self-healing array. The array system 40 may use the system 10 of FIG. 1. In other embodiments, the array system 40 may use varying systems or methods. The array system 40 comprises array control subsystem 42, diagnostics subsystem 44, auto-correction subsystem 46, and array reconfiguration subsystem 48. The array control subsystem 42 is configured to manage the full operation of the array system 40 including periodic execution of the self-healing subsystems of the array system 40 including diagnostics subsystem 44, auto-correction subsystem 46, and array reconfiguration subsystem 48.

The diagnostics subsystem 44 is configured to monitor, detect, and diagnose the failure of each individual array element of the array system 40. Example methods for monitoring include algorithms that use embedded sensors to sample observables such as the DC current and voltage of its power lines, the surface and ambient temperatures, and the output power and phase of its amplifiers. Example methods for detecting include algorithms that compare the sampled values to reference (baseline) values to determine if they have deviated beyond the reference to the extent that would be considered a failure. Example methods for diagnosing include algorithms that analyze the values that were used for detecting the failure, as well as other contextual data, to determine the type of failure that may have occurred. The type of failure is identified using a classification model that groups failures according to their observable characteristics and their impact on the performance of the array system 40. The classification of the failure guides the actions taken in the subsequent stages of self-healing.

A more specific example is provided in the context of monitoring, detecting, and diagnosing the failure of the Power Amplifier (PA) of the element. An output power failure of the PA may be diagnosed, indirectly, by detecting deviations in the drain current of its transistors. Models produced from data of previous PA power output failures indicate that a drop in drain current is correlated with a drop in PA output power. This may also be diagnosed, directly, by detecting deviations in the output power using power detection sensors on the element (e.g. microstrip based sensors on the GaN chip that measure output power at the interface between the element and its antenna feed), or similar power sensors near the element's antennas embedded in the array aperture. An output phase failure of the PA may be diagnosed, directly, using sensors on the element or embedded in the array aperture. It may also be detected, indirectly, from models produced from data from previous PA power output failures that indicate that a deviation in output power is correlated with deviations in output phase.

The auto-correction subsystem 46 is configured to select and administer adjustments to the failed element's input and control parameters that are designed to bring its performance within the range of its original performance specifications, or within the range of acceptable performance according to the status and operation of the array. Example methods for auto-correction include algorithms that, given the failure data from the diagnostics subsystem 44 and the operational context of the element within the array, select one or more "tunable" parameters of the element and adjust them to correct for the performance deviation. The tunable parameters of the element include control parameters such as the bias voltages of the elements amplifiers, settings of the phase shifters and attenuators in the input and output paths of the element, and settings of variable temperature controls. The tunable parameters of the element also include input parameters such as the power of the input signal.

Selection of which parameters to choose and what adjustments to make can be based on, for example, models derived empirically from data collected in lab-based experiments or "learned" in-situ using techniques from machine-learning. They may also be based on, for example, theoretical models derived using tools from mathematical physics or physics-based simulation tools. Furthermore, these algorithms may run "open-loop," applying adjustments with no feedback on their impact on the element's performance, or "closed-loop," applying adjustments using feedback in the form of sample data from the performance sensors of the diagnostics subsystem 44 and applying iterative optimization algorithms to find the optimal, or acceptable sub-optimal, set of adjustments.

A more specific example is in the form of a closed-loop, feedback-based, auto-correction algorithm that applies adjustments for correcting a failure in the power stage of the PA that results in a drop in maximum power output. Here, the algorithm first attempts to adjust the gate bias voltages of the transistors in the PA's output stage if samples collected from the power and phase sensors of the diagnostics subsystem 44 determine that the power output of the PA has been adjusted to within tolerable specifications for the metrics of interest (e.g. power and distortion). If adjusting the gate bias voltages fails, then the algorithm falls back to adjusting the settings of the calibration and/or beam attenuators in the output path. If adjusting the attenuators fails, then the algorithm falls back to adjusting the drain voltages of the transistors in the PA's output stage. If all of these adjustments fail to bring the output power of the PA within tolerable specifications, then the least destructive settings are chosen and the subsystem flags the array as operating in "degraded" mode.

The array reconfiguration subsystem 48 is configured to select and administer adjustments to input and control parameters of the array to compensate for one or more elements that failed auto-correction for the purposes of bringing the performance of the array to within its original performance specifications, or within the range of acceptable performance according to its status and operation. Example algorithms for array reconfiguration can be classified into three groups according to the sequence in which they are applied: (1) online reconfiguration algorithms; (2) crippled-mode reconfiguration algorithms; and (3) offline reconfiguration algorithms.

Online reconfiguration algorithms attempt to adjust array parameters with minimal latency, at the possible expense of optimality, for the purpose of compensating for the element failure without disrupting the normal operation of the array. If the online reconfiguration algorithms fail, then the array is classified as operating in "crippled-mode," whereby the array is providing useful performance for the demands of the operational context, but is out of tolerable performance specifications. The crippled-mode reconfiguration algorithms attempt to adjust array parameters by applying optimization techniques to find the optimal, or acceptable sub-optimal set of adjustments that don't require taking the array offline (e.g. they can execute in parallel with the array without interfering with the array's performance to the extent of its operational context). If the crippled-mode reconfiguration algorithms fail to bring the array out of crippled-mode within a tolerable time window for the operational context of the array, then the array is classified as "failed" and taken offline. The offline reconfiguration algorithms attempt to adjust array parameters by applying optimization techniques to find the optimal, or acceptable suboptimal set of adjustments without constraints on access to the array (e.g. they may demand full usage of the available resources of the array, including all input, diagnostics, and control subsystems).

The array parameters that are targeted for adjustment by the array reconfiguration algorithms include, for example, the attenuator and phase shifter settings for each element in the array, the operational state of each element (e.g. fully-on, fully-off, transmit-only, receive-only, etc.) or groups of elements (e.g. sub-array on/off), and characteristics of the input signal (e.g. power level, modulation, coding, etc.). A specific example of an online reconfiguration algorithm includes a heuristic compensation algorithm that applies adjustments to attenuator and phase shifter settings according to simple rule-sets. For example, degradation of the output power of the PA of an element can be compensated for a plane of interest (e.g. azimuth, elevation) by a proportional increase in the output power (i.e. decreasing the attenuation) of the element's neighbors that are aligned along the vector that passes through the failed element and is normal to the plane of interest. For example, if the plane of interest is azimuth, then if the power of the failed element is divided equally and added to the neighbors that are immediately above and below the failed element in the elevation plane (i.e. they project to the same point in the azimuth plane), then the array radiation pattern in the azimuth plane can be corrected with near-perfect results. Such an adjustment can be applied with very little latency, at the expense of a suboptimal result (i.e. correction in the azimuth plane results in distortion in the elevation and inter-cardinal planes).

A specific example of a crippled-mode reconfiguration algorithm is one that executes a stochastic search algorithm that tries to find a set of beam weights that result in a synthesized radiation pattern that is within specifications. Such a reconfiguration algorithm may also iteratively adjust the array synthesis based on actual measured data from the array, for instance by using the existing built-in self-testing features of the array. Given the resource constraints, it is anticipated that crippled-mode reconfiguration algorithms may be run on another processor in parallel to the main array processor, such as on a host processor. Alternatively, these algorithms may be run in the array processor between pulses if sufficient resources are available to make reasonable progress over the duration of the specified mission. Specific algorithms for offline reconfiguration include resource intensive stochastic optimization of beam weights using the full complement of built-in self-test modes to both guide and measure the results of the algorithms.

In other embodiments, the array system 40 of FIG. 2 may contain varying subsystems which may vary in function.

Figure 3:
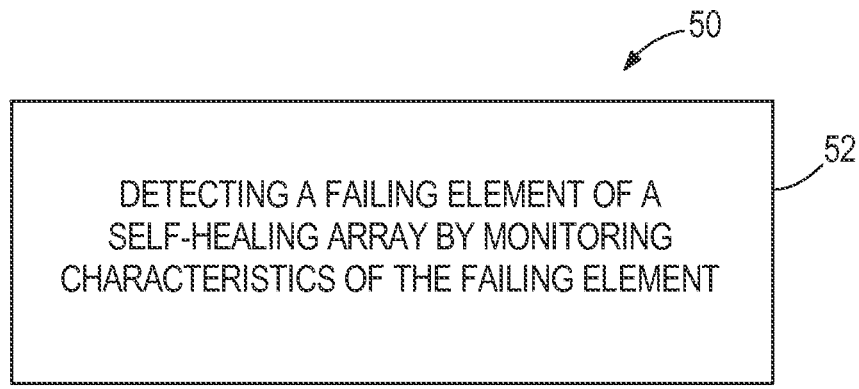
FIG. 3 illustrates a flowchart of one embodiment of a method of handling failure in a self-healing array.

FIG. 3 illustrates a flowchart of one embodiment of a method 50 of handling failure in a self-healing array. The system 10 of FIG. 1 or the array system 40 of FIG. 2 may be used in implementing the method 50. In other embodiments, varying systems may be used. In one embodiment, the method 50 may be implemented in the diagnostics subsystem 44 of the array system 40 of FIG. 2. In step 52 a failing element of the self-healing array is detected by monitoring characteristics of the failing element while online. In one embodiment, step 52 comprises monitoring an amplifier module of the failing element. In another embodiment, step 52 comprises monitoring direct current of an amplifier module of the failing element. In still another embodiment, step 52 comprises monitoring a temperature of an amplifier module of the failing element. In yet another embodiment, step 52 comprises monitoring an output phase of an amplifier module of the failing element. In an additional embodiment, step 52 comprises monitoring an output power of an amplifier module of the failing element. In still other embodiments, one or more steps of the method 50 may be varied in substance or order, one or more steps of the method may be not followed, or one or more additional steps may be added.

Figure 4:
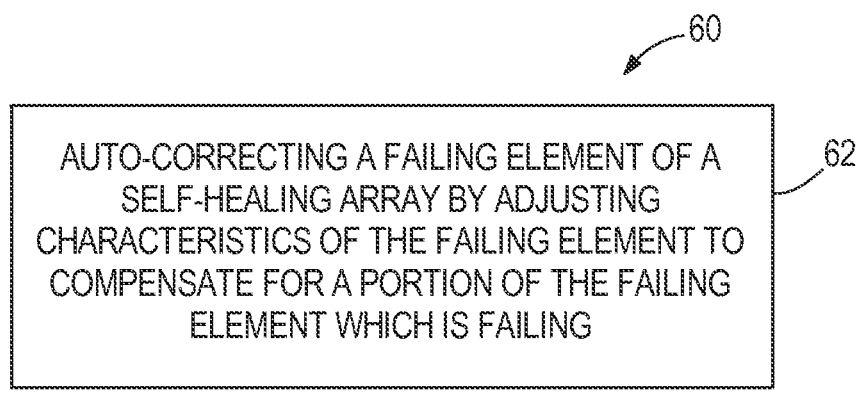
FIG. 4 illustrates a flowchart of one embodiment of a method of handling failure in a self-healing array.

FIG. 4 illustrates a flowchart of one embodiment of a method 60 of handling failure in a self-healing array. The system 10 of FIG. 1 or the array system 40 of FIG. 2 may be used in implementing the method 60. In other embodiments, varying systems may be used. In one embodiment, the method 60 may be implemented in the auto-correction subsystem 46 of the array system 40 of FIG. 2. In step 62 a failing element of the self-healing array is auto-corrected by adjusting characteristics of the failing element to compensate for a portion of the failing element while operating online. In one embodiment, step 62 comprises adjusting an amplifier module of the failing element. In another embodiment, step 62 comprises adjusting direct current of an amplifier module of the failing element. In yet another embodiment, step 62 comprises adjusting at least one attenuator of an amplifier module of the failing element. In still another embodiment, step 62 comprises adjusting at least one phase shifter of an amplifier module of the failing element. In an additional embodiment, step 62 comprises adjusting a temperature of an amplifier module of the failing element. In another embodiment, step 62 comprises adjusting an input signal of an amplifier module of the failing element. In still other embodiments, one or more steps of the method 60 may be varied in substance or order, one or more steps of the method may be not followed, or one or more additional steps may be added.

Figure 5:
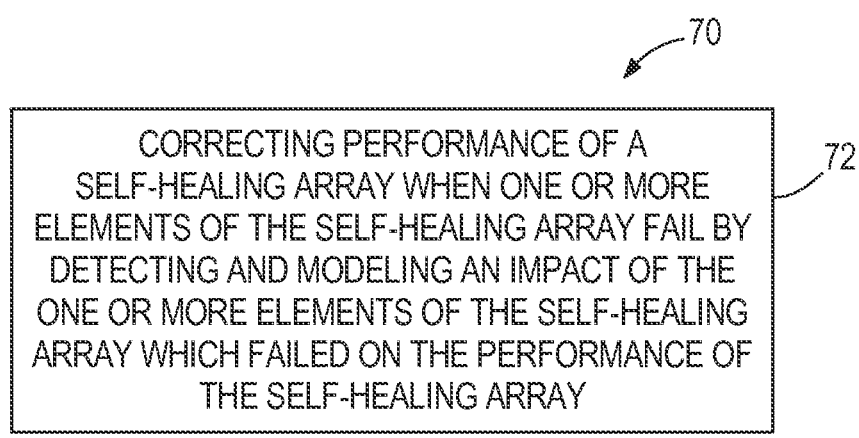
FIG. 5 illustrates a flowchart of one embodiment of a method of handling failure in a self-healing array.

FIG. 5 illustrates a flowchart of one embodiment of a method 70 of handling failure in a self-healing array. The system 10 of FIG. 1 or the array system 40 of FIG. 2 may be used in implementing the method 70. In other embodiments, varying systems may be used. In one embodiment, the method 70 may be implemented in the array reconfiguration subsystem 48 of the array system 40 of FIG. 2. In step 72 performance of the self-healing array is corrected when one or more elements of the self-healing array fail by detecting and modeling an impact of the one or more elements of the self-healing array which failed on the performance of the self-healing array. In one embodiment, step 72 comprises performing an online reconfiguration of the self-healing array. In another embodiment, step 72 comprises performing a crippled-mode reconfiguration of the self-healing array. In yet another embodiment, step 72 comprises performing an offline reconfiguration of the self-healing array. In another embodiment, step 72 comprises adjusting at least one attenuator of the self-healing array. In still another embodiment, step 72 comprises adjusting at least one phase shifter of the self-healing array. In an additional embodiment, step 72 comprises adjusting at least one input signal of the self-healing array. In still other embodiments, one or more steps of the method 70 may be varied in substance or order, one or more steps of the method may be not followed, or one or more additional steps may be added.

In still other embodiments, any of the systems 10 and 40 of FIGS. 1 and 2 and any of the methods 50, 60, and 70 of FIGS. 3, 4, and 5 may be combined in any number or order to self-heal the array. In other embodiments, varying systems and methods may be used to self-heal the array.

One or more embodiments of the disclosure may have one or more of the following advantages over current self-healing arrays systems and methods: allow the self-healing array to be self-healed while online with minimal added hardware; allow the self-healing array to follow multiple stages of self-healing first while the array is online and active, and second, only if needed, while the array is offline with minimal added hardware; allow for the self-healing array to operate in a degraded mode operation when suboptimal performance is desirable over the alternatives; or have one or more other advantages.

The Abstract is provided to allow the reader to quickly ascertain the nature of the technical disclosure. It is submitted with the understanding that it will not be used to interpret or limit the scope or meaning of the claims. In addition, in the foregoing Detailed Description, it can be seen that various features are grouped together in various embodiments for the purpose of streamlining the disclosure. This method of disclosure is not to be interpreted as reflecting an intention that the claimed embodiments require more features than are expressly recited in each claim. Rather, as the following claims reflect, inventive subject matter lies in less than all features of a single disclosed embodiment. Thus the following claims are hereby incorporated into the Detailed Description, with each claim standing on its own as a separately claimed subject matter.

While particular aspects of the present subject matter described herein have been shown and described, it will be apparent to those skilled in the art that, based upon the teachings herein, changes and modifications may be made without departing from the subject matter described herein and its broader aspects and, therefore, the appended claims are to encompass within their scope all such changes and modifications as are within the true scope of the subject matter described herein. Furthermore, it is to be understood that the disclosure is defined by the appended claims. Accordingly, the disclosure is not to be restricted except in light of the appended claims and their equivalents.

The invention claimed is:

1. A method of handling failure in a self-healing radar array comprising:
   detecting a failing element of the self-healing radar array by monitoring characteristics of the failing element; and
   adjusting, in response to detecting the failing element, output power of one or more neighboring elements of the failing element in the self-healing radar array to maintain a desired array radiation pattern, wherein the one or more neighboring elements are aligned along a vector that passes through the failing element and is normal to one of an azimuth plane and elevation plane.

2. The method of claim 1 wherein the monitoring the characteristics of the failing element comprises monitoring an amplifier module of the failing element.

3. The method of claim 1 wherein the monitoring the characteristics of the failing element comprises monitoring direct current of an amplifier module of the failing element.

4. The method of claim 1 wherein the monitoring the characteristics of the failing element comprises monitoring a temperature of an amplifier module of the failing element.

5. The method of claim 1 wherein the monitoring the characteristics of the failing element comprises monitoring an output phase of an amplifier module of the failing element.

6. The method of claim 1 wherein the monitoring the characteristics of the failing element comprises monitoring an output power of an amplifier module of the failing element.

7. A method of handling failure in a self-healing radar array comprising:
   auto-correcting a failing element of the self-healing radar array by adjusting characteristics of the failing element to compensate for a portion of the failing element which is failing; and
   adjusting, in response to detecting the failing element, output power of one or more neighboring elements of the failing element in the self-healing radar array to maintain a desired array radiation pattern, wherein the one or more neighboring elements are aligned along a vector that passes through the failing element and is normal to one of an azimuth plane and elevation plane.

8. The method of claim 7 wherein the adjusting characteristics of the failing element comprises adjusting an amplifier module of the failing element.

9. The method of claim 7 wherein the adjusting the characteristics of the failing element comprises adjusting direct current of an amplifier module of the failing element.

10. The method of claim 7 wherein the adjusting the characteristics of the failing element comprises adjusting at least one attenuator of an amplifier module of the failing element.

11. The method of claim 7 wherein the adjusting the characteristics of the failing element comprises adjusting at least one phase shifter of an amplifier module of the failing element.

12. The method of claim 7 wherein the adjusting the characteristics of the failing element comprises adjusting a temperature of an amplifier module of the failing element.

13. A method of handling failure in a self-healing array comprising:
   correcting performance of the self-healing array when one or more elements of the self-healing array fail by detecting and modeling an impact of the one or more elements of the self-healing array which failed on the performance of the self-healing array, wherein the detecting and modeling the impact of the one or more elements of the self-healing array which failed comprises performing a crippled-mode reconfiguration of the self-healing array; and
   mitigating an effect caused by the one or more elements that failed on the performance of the self-healing array by adjusting output power of one or more neighboring elements of the failing element in the self-healing array, and
   wherein the one or more neighboring elements are aligned along a vector that passes through at least one of the one or more elements which failed and is normal to one of an azimuth plane and elevation plane.

14. The method of claim 13 wherein the detecting and modeling the impact of the one or more elements of the self-healing array which failed comprises performing an online reconfiguration of the self-healing array.

15. The method of claim 13 wherein the detecting and modeling the impact of the one or more elements of the self-healing array which failed comprises performing an offline reconfiguration of the self-healing array.

16. The method of claim 13 wherein the detecting and modeling the impact of the one or more elements of the self-healing array which failed comprises adjusting at least one attenuator of the self-healing array.

17. The method of claim 13 wherein the detecting and modeling the impact of the one or more elements of the self-healing array which failed comprises adjusting at least one phase shifter of the self-healing array.

* * * * *